(12) United States Patent
Hsu

(10) Patent No.: US 7,892,723 B2
(45) Date of Patent: Feb. 22, 2011

(54) METHOD FOR FORMING PATTERNED PHOTORESIST LAYER

(75) Inventor: Te-Shao Hsu, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 540 days.

(21) Appl. No.: 11/939,741

(22) Filed: Nov. 14, 2007

(65) Prior Publication Data

US 2009/0124095 A1    May 14, 2009

(51) Int. Cl.
*G03F 7/26* (2006.01)

(52) U.S. Cl. ..................... 430/327; 430/311

(58) Field of Classification Search ............... 430/311, 430/327
See application file for complete search history.

(56) References Cited

U.S. PATENT DOCUMENTS

| 7,144,673 | B2 | 12/2006 | Chen et al. | |
| 2009/0081591 | A1* | 3/2009 | Lu et al. | 430/296 |

* cited by examiner

*Primary Examiner*—Kathleen Duda
(74) *Attorney, Agent, or Firm*—WPAT, PC; Justin King

(57) ABSTRACT

A method for forming a patterned photoresist is provided, which is applicable to a substrate. The method includes: performing an implantation process over the substrate; next, performing a surface treatment process; then, forming a photoresist layer over the substrate; and thereafter, patterning the photoresist layer.

22 Claims, 1 Drawing Sheet

METHOD FOR FORMING PATTERNED PHOTORESIST LAYER

BACKGROUND OF THE INVENTION

1. Field of the Invention

The present invention relates to a semiconductor process. More particularly, the present invention relates to a method for forming a patterned photoresist layer.

2. Description of Related Art

Pressed by the growing requirements on circuit integration, the size of circuit devices is designed to be smaller and smaller. In the whole semiconductor process, photolithography process is the most important. Those relevant to the structure of a metal-oxide-semiconductor (MOS) device, for example, patterns of thin films, and regions doped with dopants, are determined by the photolithography step. Furthermore, whether the device integration of the entire semiconductor industry can be developed toward to obtain a smaller line width is also determined by the development of photolithography process technology.

However, during the implantation process, oil and gas or free radicals in the reaction chamber will be polymerized to form polymer contaminants on the surface of a wafer due to the bombardment of the implanted ions. Thus, during the photolithography process following the implantation process to form a patterned photoresist on the wafer, the formed photoresist layer may have dopants caused by the residual contaminants on the surface of the wafer. As a result, after patterning the photoresist, the pattern transferred from the mask to the photoresist is deformed. Therefore, the devices produced subsequently have defects, which will result in undesirable electrical performance, and thus reduce the product yield.

SUMMARY OF THE INVENTION

Accordingly, the present invention is directed to a method for forming a patterned photoresist, so as to reduce the number of defects caused by residual contaminants of an implantation process.

The present invention is further directed to a method for forming a patterned photoresist, so as to effectively remove residual contaminants on the surface of a substrate, thus improving the product yield.

A method for forming a patterned photoresist is provided, which is applicable to a substrate. The method includes: performing an implantation process over the substrate; next, performing a surface treatment process; then, forming a photoresist layer over the substrate; and thereafter, patterning the photoresist layer.

In the method for forming a patterned photoresist according to an embodiment of the present invention, the surface treatment process includes cleaning the substrate with a photoresist removing solution. Before cleaning the substrate with the photoresist removing solution, the surface treatment process further includes performing a wet cleaning step. The wet cleaning step includes spraying the substrate with a deionized water or immersing the substrate with the deionized water. The wet cleaning step further includes a deionized water puddle step. Furthermore, the photoresist removing solution is one selected from a group consisting of CAROZ, N-methyl-2-pyrrolidone (NMP), RCA solution, and diluted hydrofluoric acid.

In the method for forming a patterned photoresist according to an embodiment of the present invention, a plasma surface treatment process is performed before the surface treatment process. The plasma surface treatment process includes an oxygen plasma.

In the method for forming a patterned photoresist according to an embodiment of the present invention, the implantation process includes a blanket implantation process.

In the method for forming a patterned photoresist according to an embodiment of the present invention, a rinse puddle step is performed after patterning the photoresist layer. The duration of the rinse puddle step is at most 90 sec.

In the method for forming a patterned photoresist according to an embodiment of the present invention, the substrate has at least one material layer disposed thereon. The material of the material layer includes silicon, poly-silicon, and a conductive material.

Another method for forming a patterned photoresist is provided, which is applicable to a substrate. The method includes: performing an implantation process over the substrate; next, performing a wet treatment process; then, forming a photoresist layer over the substrate; and thereafter, patterning the photoresist layer.

According to a method for forming a patterned photoresist of embodiments of the present invention, the wet treatment process adopts a solution selected from a group consisting of CAROZ, NMP, RCA solution, and diluted hydrofluoric acid.

The method for forming a patterned photoresist as claimed in claim 14 further includes performing a wet cleaning step before performing the wet treatment process. The wet cleaning step includes spraying the substrate with a deionized water or immersing the substrate with the deionized water. Additionally, the wet cleaning step further includes a deionized water puddle step.

In the method for forming a patterned photoresist according to an embodiment of the present invention, a plasma surface treatment process is performed before the wet treatment process. The plasma surface treatment process includes an oxygen plasma.

In the method for forming a patterned photoresist according to an embodiment of the present invention, the implantation process includes a blanket implantation process.

In the method for forming a patterned photoresist according to an embodiment of the present invention, a rinse puddle step is performed after patterning the photoresist layer. The duration of the rinse puddle step is at most 90 sec.

In the method for forming a patterned photoresist according to an embodiment of the present invention, the substrate has at least one material layer disposed thereon. The material of the material layer includes silicon, poly-silicon, and a conductive material.

In the present invention, after performing the implantation process, and before forming the photoresist layer, a surface treatment process is performed to remove the contaminants generated during the implantation process and remained on the surface of the substrate or the surface of the material layer over the substrate, so as to reduce the number of defects caused by the residual contaminants in subsequent processes, thus improving the product yield.

In order to make the aforementioned and other objectives, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
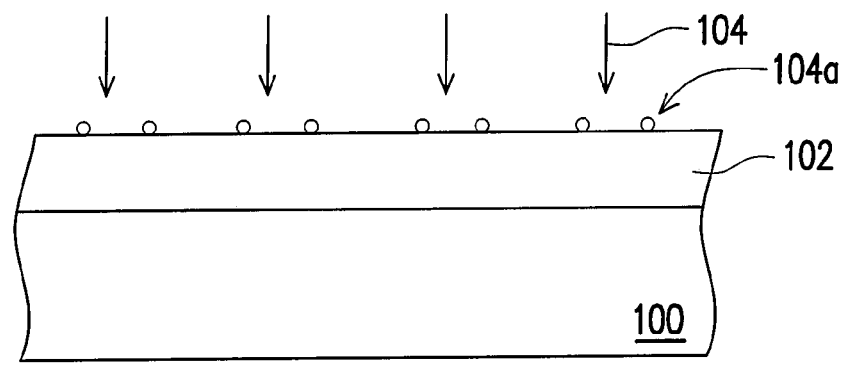
FIGS. 1A to 1C are cross-sectional views of a method for forming a patterned photoresist layer according to an embodiment of the present invention.
Figure 1B:
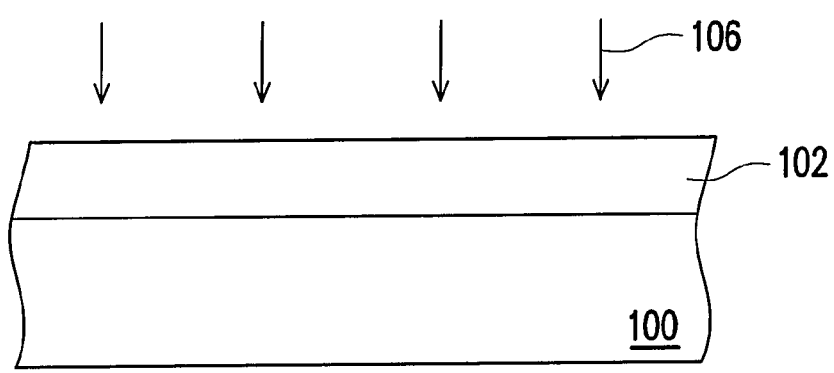
Figure 1C:
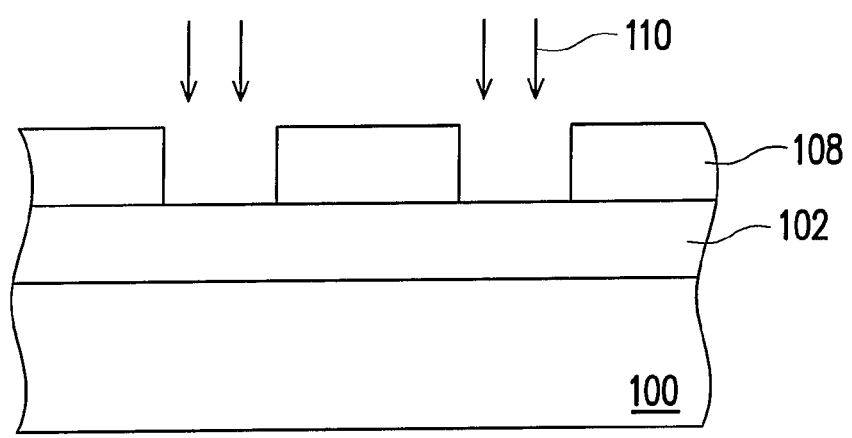

FIGS. 1A to 1C are cross-sectional views of a method for forming a patterned photoresist layer according to an embodiment of the present invention. Referring to FIG. 1A, first, a substrate 100 is provided. The substrate 100 is, for example, a silicon substrate. The substrate 100 has at least one material layer 102 disposed thereon. The material of the material layer 102 is, for example, silicon, poly-silicon, or a conductive material. Next, an implantation process 104, for example, an implantation process of boron ions, phosphorus ions, or arsenic ions, is performed over the substrate 100. Furthermore, the implantation process 104 is, for example, a blanket implantation process. During the implantation process 104, some contaminants 104a in the process reaction chamber will remain on the surface of the substrate 100 or the material layer 102.

Afterward, referring to FIG. 1B, a surface treatment process 106 is performed to remove the contaminants 104a remained over the substrate 100 (FIG. 1A). The surface treatment process 106 is, for example, a wet treatment process. The wet treatment process is, for example, to clean the substrate 100 with a cleaning solution including a photoresist removing solution. The cleaning solution includes CAROZ, NMP, RCA solution (a solution widely used in the industry for wet wafer cleaning, which is developed by Kern and Puotinen in RCA laboratory founded by Radio Corporation of America, RCA Line 51, in 1960), and diluted hydrofluoric acid, or a combination thereof. In the CAROZ solution, the volume ratio of the ingredients, for example, sulfuric acid and hydrogen peroxide, is about 4:1. Additionally, in the RCA solution, the volume ratio of the ingredients, for example, ammonium hydroxide, hydrogen peroxide, and deionized water, is about 0.5:4:20.

Moreover; in an embodiment, a plasma surface treatment process is performed before the surface treatment 106, for example, bombarding the substrate 100 with an oxygen plasma. Further, in an embodiment, a wet cleaning step is performed before the wet treatment process, for example, spraying the substrate 100 with a deionized water or immersing the substrate 100 with the deionized water. In addition, the wet cleaning step further includes a deionized water puddle step. In an embodiment, after performing an implantation process over the substrate 100, a wet cleaning step including spraying the substrate 100 with a deionized water and then performing a deionized water puddle step for about 30 sec is performed. Thereafter, it is found by subsequent wafer inspection that, the average number of defects on a wafer after the surface treatment is approximately less than 50. In another embodiment, a surface treatment process merely by the diluted hydrofluoric acid and the RCA solution is performed over the substrate 100 following the implantation process. After that, it is found by subsequent wafer inspection that, the average number of defects on a wafer after the surface treatment is approximately less than 20. Further, in an embodiment, after performing the implantation process on the substrate 100, a wet cleaning step is performed to wet the substrate 100 with a deionized water, and then a wet treatment process is performed on the substrate 100 with CAROZ solution. After that, it is found by subsequent wafer inspection that, the average number of defects on a wafer after the surface treatment is zero. That is, after the surface treatment, the contaminants 104a on the surface of the wafer are removed, and thus the number of defects caused by the residual contaminants 104a is reduced.

Referring to FIG. 1C, after the surface treatment process 106, a photoresist layer (not shown) is formed on the substrate 100, and then the photoresist layer is patterned to form a patterned photoresist layer 108. In an embodiment, after patterning the photoresist layer, a rinse puddle step 110 is perform to further clean the substrate 100, so as to completely remove the residual contaminants. The rinse puddle step is, for example, to immerse the substrate 100 with a deionized water, and the immersing time is no longer than 90 sec.

In view of the above, in the present invention, after performing the implantation process, and before forming the photoresist layer, a surface treatment process is performed to remove the contaminants generated during the implantation process and remained on the surface of the substrate or the surface of the material layer over the substrate, so as to reduce the number of defects caused by the residual contaminants in subsequent processes, thus improving the product yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a patterned photoresist, applicable to a substrate, comprising:
   performing an implantation process on the substrate;
   performing a plasma surface treatment process;
   performing a surface treatment process after the plasma surface treatment process;
   forming a photoresist layer over the substrate after the surface treatment process; and patterning the photoresist layer.

2. The method for forming a patterned photoresist as claimed in claim 1, wherein the surface treatment process comprises cleaning the substrate with a photoresist removing solution.

3. The method for forming a patterned photoresist as claimed in claim 2, wherein before cleaning the substrate with the photoresist removing solution, the surface treatment process further comprises performing a wet cleaning step.

4. The method for forming a patterned photoresist as claimed in claim 3, wherein the wet cleaning step comprises spraying the substrate with a deionized water or immersing the substrate with the deionized water.

5. The method for forming a patterned photoresist as claimed in claim 4, wherein the wet cleaning step further comprises a deionized water puddle step.

6. The method for forming a patterned photoresist as claimed in claim 1, wherein the implantation process comprises a blanket implantation process.

7. The method for forming a patterned photoresist as claimed in claim 1, further comprising performing a rinse puddle step after patterning the photoresist layer.

8. The method for forming a patterned photoresist as claimed in claim 7, wherein the duration of the rinse puddle step is at most 90 sec.

9. The method for forming a patterned photoresist as claimed in claim 1, wherein the substrate has at least one material layer disposed thereon.

10. The method for forming a patterned photoresist as claimed in claim 9, wherein the material of the material layer comprises silicon, poly-silicon, and a conductive material.

11. A method for forming a patterned photoresist, applicable to a substrate, comprising:
    performing an implantation process on the substrate;
    performing a wet treatment process after the implantation process;
    forming a photoresist layer over the substrate after the wet treatment process; and
    patterning the photoresist layer.

12. The method for forming a patterned photoresist as claimed in claim 11, further comprising performing a wet cleaning step before performing the wet treatment process.

13. The method for forming a patterned photoresist as claimed in claim 12, wherein the wet cleaning step comprises spraying the substrate with a deionized water or immersing the substrate with the deionized water.

14. The method for forming a patterned photoresist as claimed in claim 13, wherein the wet cleaning step further comprises a deionized water puddle step.

15. The method for forming a patterned photoresist as claimed in claim 11, further comprising performing a plasma surface treatment process before performing the wet treatment process.

16. The method for forming a patterned photoresist as claimed in claim 15, wherein the plasma surface treatment process comprises an oxygen plasma.

17. The method for forming a patterned photoresist as claimed in claim 11, wherein the implantation process comprises a blanket implantation process.

18. The method for forming a patterned photoresist as claimed in claim 11, further comprising performing a rinse puddle step after patterning the photoresist layer.

19. The method for forming a patterned photoresist as claimed in claim 18, wherein the duration of the rinse puddle step is at most 90 sec.

20. The method for forming a patterned photoresist as claimed in claim 11, wherein the substrate has at least one material layer disposed thereon.

21. The method for forming a patterned photoresist as claimed in claim 20, wherein the material of the material layer comprises silicon, poly-silicon, and a conductive material.

22. A method for forming a patterned photoresist, applicable to a substrate, comprising:
    performing an implantation process on the substrate;
    cleaning the substrate with a photoresist removing solution after the implantation process;
    forming a photoresist layer over the substrate after the cleaning step of the substrate with the photoresist removing solution; and
    patterning the photoresist layer.

\* \* \* \* \*